United States Patent
Malhotra et al.

(10) Patent No.: US 9,012,298 B2
(45) Date of Patent: *Apr. 21, 2015

(54) METHODS FOR REPRODUCIBLE FLASH LAYER DEPOSITION

(71) Applicants: Intermolecular, Inc., San Jose, CA (US); Elpida Memory, Inc, Tokyo (JP)

(72) Inventors: Sandra G. Malhotra, Fort Collins, CO (US); Hiroyuki Ode, Higashihiroshima (JP); Xiangxin Rui, Campbell, CA (US)

(73) Assignees: Intermolecular, Inc., San Jose, CA (US); Elpida Memory, Inc., Tokyo (JP)

( * ) Notice: Subject to any disclaimer, the term of this patent is extended or adjusted under 35 U.S.C. 154(b) by 238 days.

This patent is subject to a terminal disclaimer.

(21) Appl. No.: 13/731,452

(22) Filed: Dec. 31, 2012

(65) Prior Publication Data
US 2014/0187018 A1    Jul. 3, 2014

(51) Int. Cl.
*H01L 21/02*  (2006.01)
*H01G 4/008*  (2006.01)
*H01L 49/02*  (2006.01)

(52) U.S. Cl.
CPC ............... *H01L 28/56* (2013.01); *H01L 28/65* (2013.01); *H01L 28/75* (2013.01)

(58) Field of Classification Search
CPC .............. H01L 21/02186; H01L 21/3141; H01L 21/28194; H01L 28/56; H01G 4/10; H01G 4/1218

USPC ............... 438/104, 240, 396; 361/305
See application file for complete search history.

(56) References Cited

U.S. PATENT DOCUMENTS

| | | | |
|---|---|---|---|
| 2006/0151845 A1* | 7/2006 | Govindarajan | 257/411 |
| 2009/0283856 A1* | 11/2009 | Huang et al. | 257/532 |
| 2011/0275215 A1 | 11/2011 | Gatineau et al. | |
| 2011/0305064 A1 | 12/2011 | Jo et al. | |
| 2012/0309162 A1* | 12/2012 | Chen et al. | 438/396 |
| 2013/0154056 A1* | 6/2013 | Tonari | 257/532 |
| 2013/0200491 A1* | 8/2013 | Wamura et al. | 257/532 |
| 2014/0080283 A1* | 3/2014 | Song et al. | 438/396 |
| 2014/0183695 A1* | 7/2014 | Malhotra et al. | 257/532 |

* cited by examiner

*Primary Examiner* — Brett Feeney
*Assistant Examiner* — Pamela E Perkins

(57) ABSTRACT

A method for reducing the leakage current in DRAM Metal-Insulator-Metal capacitors includes forming a flash layer between the dielectric layer and the first electrode layer. A method for reducing the leakage current in DRAM Metal-Insulator-Metal capacitors includes forming a capping layer between the dielectric layer and the second electrode layer. The flash layer and the capping layer can be formed using an atomic layer deposition (ALD) technique. The precursor materials used for forming the flash layer and the capping layer are selected such they include at least one metal-oxygen bond. Additionally, the precursor materials are selected to also include "bulky" ligands.

12 Claims, 9 Drawing Sheets

METHODS FOR REPRODUCIBLE FLASH LAYER DEPOSITION

This document relates to the subject matter of a joint research agreement between Intermolecular, Inc. and Elpida Memory, Inc.

FIELD OF THE DISCLOSURE

The present disclosure relates generally to the field of dynamic random access memory (DRAM), and more particularly to methods of forming a capacitor stack for improved DRAM performance.

BACKGROUND OF THE DISCLOSURE

Dynamic Random Access Memory utilizes capacitors to store bits of information within an integrated circuit. A capacitor is formed by placing a dielectric material between two electrodes formed from conductive materials. A capacitor's ability to hold electrical charge (i.e., capacitance) is a function of the surface area of the capacitor plates A, the distance between the capacitor plates d, and the relative dielectric constant or k-value of the dielectric material. The capacitance is given by:

$$C = \kappa \varepsilon_o \frac{A}{d} \quad \text{(Eqn. 1)}$$

where $\varepsilon_o$ represents the vacuum permittivity.

The dielectric constant is a measure of a material's polarizability. Therefore, the higher the dielectric constant of a material, the more electrical charge the capacitor can hold. Therefore, for a given desired capacitance, if the k-value of the dielectric is increased, the area of the capacitor can be decreased to maintain the same cell capacitance. Reducing the size of capacitors within the device is important for the miniaturization of integrated circuits. This allows the packing of millions (mega-bit (Mb)) or billions (giga-bit (Gb)) of memory cells into a single semiconductor device. The goal is to maintain a large cell capacitance (generally ~10 to 25 fF) and a low leakage current (generally $<10^{-7}$ A cm$^{-2}$). The physical thickness of the dielectric layers in DRAM capacitors could not be reduced unlimitedly in order to avoid leakage current caused by tunneling mechanisms which exponentially increase as the thickness of the dielectric layer decreases.

Traditionally, SiO$_2$ has been used as the dielectric material and semiconducting materials (semiconductor-insulator-semiconductor [SIS] cell designs) have been used as the electrodes. The cell capacitance was maintained by increasing the area of the capacitor using very complex capacitor morphologies while also decreasing the thickness of the SiO$_2$ dielectric layer. Increases of the leakage current above the desired specifications have demanded the development of new capacitor geometries, new electrode materials, and new dielectric materials. Cell designs have migrated to metal-insulator-semiconductor (MIS) and now to metal-insulator-metal (MIM) cell designs for higher performance.

Typically, DRAM devices at technology nodes of 80 nm and below use MIM capacitors wherein the electrode materials are metals. These electrode materials generally have higher conductivities than the semiconductor electrode materials, higher work functions, exhibit improved stability over the semiconductor electrode materials, and exhibit reduced depletion effects. The electrode materials must have high conductivity to ensure fast device speeds. Representative examples of electrode materials for MIM capacitors are metals, conductive metal oxides, conductive metal silicides, conductive metal nitrides (i.e. TiN), or combinations thereof. MIM capacitors in these DRAM applications utilize insulating materials having a dielectric constant, or k-value, significantly higher than that of SiO$_2$ (k=3.9). For DRAM capacitors, the goal is to utilize dielectric materials with k values greater than about 20. Such materials are generally classified as high-k materials. Representative examples of high-k materials for MIM capacitors are non-conducting metal oxides, non-conducting metal nitrides, non-conducting metal silicates or combinations thereof. These dielectrics may also include additional dopant materials.

A figure of merit in DRAM technology is the electrical performance of the dielectric material as compared to SiO$_2$ known as the Equivalent Oxide Thickness (EOT). A high-k material's EOT is calculated using a normalized measure of silicon dioxide (SiO$_2$ k=3.9) as a reference, given by:

$$EOT = \frac{3.9}{\kappa} \cdot d \quad \text{(Eqn. 2)}$$

where d represents the physical thickness of the capacitor dielectric.

As DRAM technologies scale below the 40 nm technology node, manufacturers must reduce the EOT of the high-k dielectric films in MIM capacitors in order to increase charge storage capacity. The goal is to utilize dielectric materials that exhibit an EOT of less than about 0.8 nm while maintaining a physical thickness of about 5-20 nm.

One class of high-k dielectric materials possessing the characteristics required for implementation in advanced DRAM capacitors are high-k metal oxide materials. Titanium dioxide and zirconium dioxide are two metal oxide dielectric materials which display significant promise in terms of serving as high-k dielectric materials for implementation in DRAM capacitors. Other metal oxide high-k dielectric materials that have attracted attention include aluminum oxide, barium-strontium-titanate (BST), hafnium oxide, hafnium silicate, niobium oxide, lead-zirconium-titanate (PZT), a bilayer of silicon oxide and silicon nitride, silicon oxy-nitride, strontium-titanate (STO), tantalum oxide, or combinations thereof.

Generally, as the dielectric constant of a material increases, the band gap of the material decreases. This leads to high leakage current in the device. As a result, without the utilization of countervailing measures, capacitor stacks implementing high-k dielectric materials may experience large leakage currents. High work function electrodes (e.g., electrodes having a work function of greater than 5.0 eV) may be utilized in order to counter the effects of implementing a reduced band gap high-k dielectric layer within the DRAM capacitor. Metals, such as platinum, ruthenium, and ruthenium oxide are examples of high work function electrode materials suitable for inhibiting device leakage in a DRAM capacitor having a high-k dielectric layer. The noble metal systems, however, are prohibitively expensive when employed in a mass production context. Moreover, electrodes fabricated from noble metals often suffer from poor manufacturing qualities, such as surface roughness, poor adhesion, and form a contamination risk in the fab.

Leakage current in capacitor dielectric materials can be due to Schottky emission, Frenkel-Poole defects (e.g. oxygen vacancies ($V_{ox}$) or grain boundaries), or Fowler-Nordheim tunneling. Schottky emission, also called thermionic emission, is a common mechanism and is the heat-induced flow of charge over an energy barrier whereby the effective barrier height of a MIM capacitor controls leakage current. The effective barrier height is a function of the difference between the work function of the electrode and the electron affinity of the dielectric. The electron affinity of a dielectric is closely related to the conduction band offset of the dielectric. The Schottky emission behavior of a dielectric layer is generally determined by the properties of the dielectric/electrode interface. Frenkel-Poole emission allows the conduction of charges through a dielectric layer through the interaction with defect sites such as vacancies, grain boundaries, and the like. As such, the Frenkel-Poole emission behavior of a dielectric layer is generally determined by the dielectric layer's bulk properties. Fowler-Nordheim emission allows the conduction of charges through a dielectric layer through tunneling. As such, the Fowler-Nordheim emission behavior of a dielectric layer is generally determined by the physical thickness of the dielectric layer. This leakage current is a primary driving force in the adoption of high-k dielectric materials. The use of high-k materials allows the physical thickness of the dielectric layer to be as thick as possible while maintaining the required capacitance (see Eqn 1 above).

SUMMARY OF THE DISCLOSURE

The following summary of the disclosure is included in order to provide a basic understanding of some aspects and features of the disclosure. This summary is not an extensive overview of the disclosure and as such it is not intended to particularly identify key or critical elements of the disclosure or to delineate the scope of the disclosure. Its sole purpose is to present some concepts of the disclosure in a simplified form as a prelude to the more detailed description that is presented below.

In some embodiments, interface layers are formed adjacent to high-k dielectric layers to reduce the leakage current through capacitor stacks or improve the k-value of the high-k dielectric layer. The interface layers are formed using an atomic layer deposition (ALD) technique. The precursor materials used for forming the interface layers are selected such they include at least one metal-oxygen bond. Additionally, the precursor materials are selected to also include "bulky" ligands. Without being bound by theory, it is believed that the metal-oxygen bond is more difficult to break than other bonds (i.e. metal-nitrogen bonds), leading to a decrease in the deposition rate. It is also believed that the bulky ligands contribute to steric hindrance during the formation of the precursor monolayer and also serve to decrease the deposition rate.

In some embodiments, the interface layer has a thickness between 1 Å and 15 Å. The thickness of the interface layer impacts the electrical performance and overall yield of the device. Therefore, precursors having a low deposition rate are desired to offer improved control over the interface layer thickness.

BRIEF DESCRIPTION OF THE DRAWINGS

To facilitate understanding, identical reference numerals have been used, where possible, to designate identical elements that are common to the figures. The drawings are not to scale and the relative dimensions of various elements in the drawings are depicted schematically and not necessarily to scale.

The techniques of the present disclosure can readily be understood by considering the following detailed description in conjunction with the accompanying drawings, in which.

DETAILED DESCRIPTION

Figure 1:
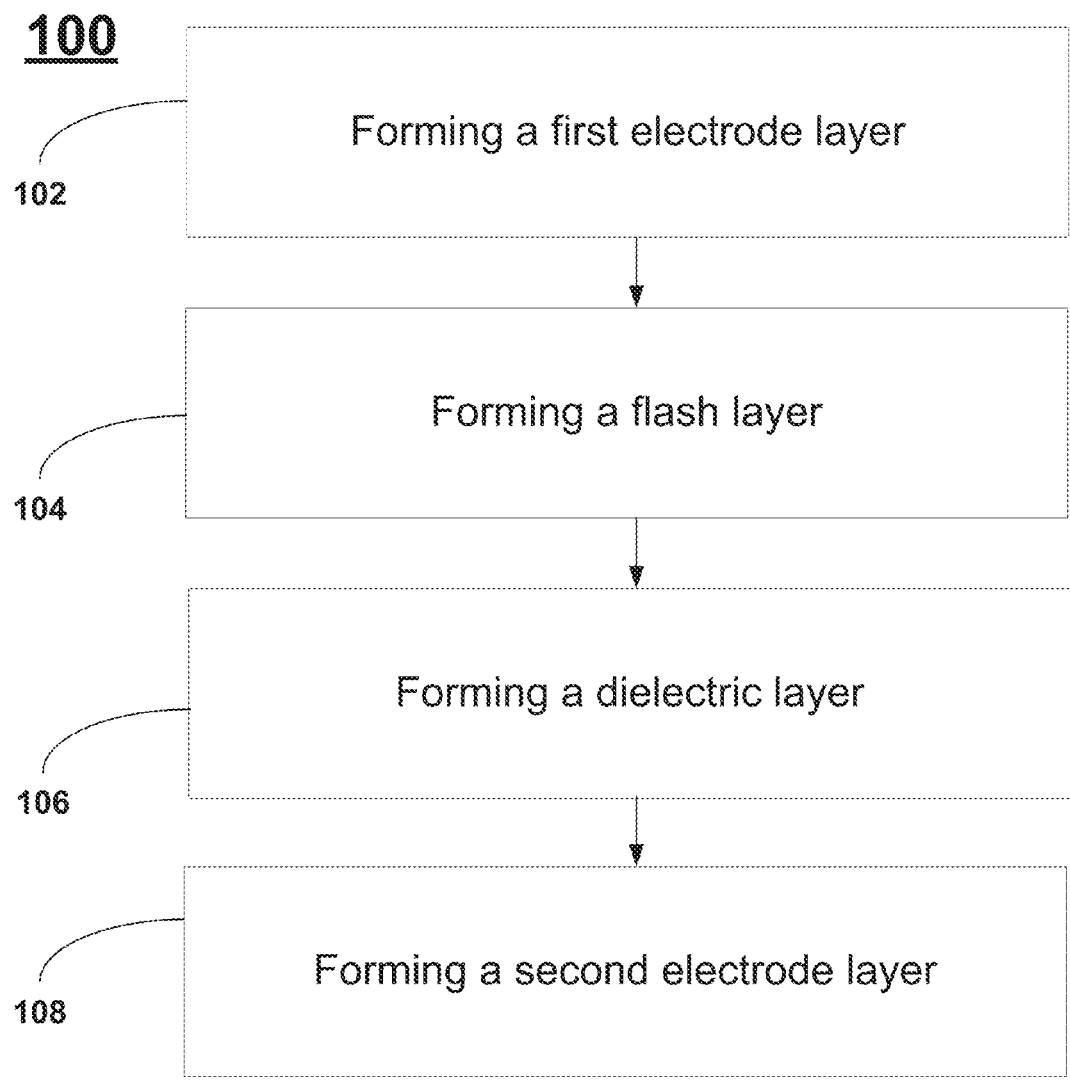
FIG. 1 illustrates a flow chart describing a method for fabricating a DRAM capacitor stack in accordance with some embodiments.

A detailed description of one or more embodiments is provided below along with accompanying figures. The detailed description is provided in connection with such embodiments, but is not limited to any particular example. The scope is limited only by the claims and numerous alternatives, modifications, and equivalents are encompassed. Numerous specific details are set forth in the following description in order to provide a thorough understanding. These details are provided for the purpose of example and the described techniques may be practiced according to the claims without some or all of these specific details. For the purpose of clarity, technical material that is known in the technical fields related to the embodiments has not been described in detail to avoid unnecessarily obscuring the description.

The mechanisms for charge transport discussed above suggest that there are several parameters that influence the leakage current across the metal-dielectric interface. Examples of the parameters include physical thickness of the dielectric material, the band gap of the dielectric material, the work function of the metal, the Schottky barrier height (SBH) between the metal and the dielectric material, etc. The SBH has been found to be influenced by many variables such as the composition of the metal and the dielectric, doping levels, defect densities, processing conditions, etc.

Metal oxide dielectric materials typically have a number of defects, including oxygen vacancies. As discussed previously, these defects contribute to leakage current through the dielectric material via a Frenkel-Poole mechanism. Methods to reduce the concentration of oxygen vacancies in metal oxide dielectric materials include the use of anneal treatments in an oxygen-containing atmosphere after the deposition of the dielectric material. However, increases in the leakage current of metal oxide dielectric materials are sometimes observed after subsequent processing steps, indicating that a more permanent solution is desired.

The discussion herein will use a simple capacitor stack as an illustration. The capacitor stack will include a first electrode layer (sometimes called a bottom electrode layer), a dielectric layer, and a second electrode layer (sometimes called a top electrode layer). Those skilled in the art will understand that each of the first electrode layer, dielectric layer, and second electrode layer may include multiple layers and multiple materials. In some embodiments, an additional layer will be inserted between the first electrode layer and the dielectric layer. As used herein, this layer will be labeled a "flash" layer. In some embodiments, an additional layer will be inserted between the dielectric layer and the second electrode layer. As used herein, this layer will be labeled a "capping" layer. The terms "first", "bottom", "second", "top", "flash", "capping", etc. are included for convenience and to assist in the description of the capacitor stack and are not meant to be limiting.

Those skilled in the art will appreciate that each of the first electrode layer, the flash layer, the dielectric layer, the capping layer, and the second electrode layer used in the DRAM MIM capacitor may be formed using any common formation technique such as atomic layer deposition (ALD), plasma enhanced atomic layer deposition (PE-ALD), atomic vapor deposition (AVD), ultraviolet assisted atomic layer deposition (UV-ALD), chemical vapor deposition (CVD), plasma enhanced chemical vapor deposition (PECVD), or physical vapor deposition (PVD). Generally, because of the complex morphology of the DRAM capacitor structure, ALD, PE-ALD, AVD, or CVD are preferred methods of formation. However, any of these techniques are suitable for forming each of the various layers discussed herein. Those skilled in the art will appreciate that the teachings described herein are not limited by the technology used for the deposition process.

In FIGS. 2, 4, 5, and 6, a capacitor stack is illustrated using a simple planar structure. Those skilled in the art will appreciate that the description and teachings herein can be readily applied to any simple or complex capacitor morphology. The drawings are for illustrative purposes only and do not limit the application of the present disclosure.

A layer may be inserted between the first electrode layer and the dielectric layer (i.e. a flash layer). The flash layer may improve the performance of the capacitor stack in several ways. First, the flash layer may protect the underlying first electrode layer from unwanted oxidation during the subsequent deposition of the dielectric material. As an example, if the first electrode layer is titanium nitride, then partial oxidation of this layer will form titanium-oxy-nitride at the surface which may increase the EOT of the capacitor and may increase the leakage current through the capacitor. A discussion of the use of flash layers to protect underlying electrode layers may be found in co-owned U.S. patent application Ser. No. 13/051,531 entitled "Electrode Treatments for Enhanced DRAM Performance" filed on Mar. 18, 2011, which is herein incorporated by reference for all purposes. Second, the flash layer may be a material with a high bandgap, and therefore, decrease the leakage current due to Schottky emission as discussed previously. A discussion of the use of flash layers to reduce leakage current may be found in co-owned U.S. patent application Ser. No. 13/238,218 entitled "Interfacial Layer for DRAM Capacitor" filed on Sep. 21, 2011, which is herein incorporated by reference for all purposes. The flash layer should have a thickness between 1 A and 10 A and should be deposited using an ALD technique.

A layer may be inserted between the dielectric layer and the second electrode layer (i.e. a capping layer). The capping layer may improve the performance of the capacitor stack in several ways. First, the capping layer may protect the underlying dielectric layer from losing oxygen, and thus forming oxygen vacancies. A discussion of the use of capping layers to reduce leakage current may be found in co-owned U.S. patent application Ser. No. 13/290,795 entitled "Blocking Layers for Leakage Current Reduction in DRAM Devices" filed on Nov. 7, 2011, which is herein incorporated by reference for all purposes. The capping layer should have a thickness between 1 A and 10 A and should be deposited using an ALD technique.

The general steps included in the deposition of materials by ALD are well known (i.e. precursor pulse-purge-oxidant pulse-purge-repeat). One cycle is defined by four steps from the precursor pulse to the oxidant purge. This sequence is repeated a number of times and the total film thickness is divided by the number of cycles to calculate a deposition rate expressed in angstroms per cycle. Generally, the deposition occurs between 200 C and 350 C and at pressures between 0.1 Torr and 2 Torr. The pulse times range from 0.1 seconds to more than 180 seconds. Typical deposition rates range from about 1 A per cycle to more than 3 A per cycle. It is difficult to deposit uniform flash layers and/or capping layers having a thickness between 1 A and 10 A using deposition rates of between 1 A per cycle and 3 A per cycle. As an example, a 1 A flash layer of titanium oxide would require only a single ALD cycle using a typical deposition rate of 1 A per cycle. This process may not be robust enough for implementation into high volume manufacturing. A slower deposition rate would allow for improved control and improved robustness in the manufacturing process.

The deposition rate may be reduced by selecting an ALD precursor that includes stable chemical bonds. As an example, ALD precursors that contain at least one metal-oxygen bond may be more stable than those that contain only metal-nitrogen bonds. The increased stability may lower the reactivity of the precursor with the oxidant and thus, lower the deposition rate. As an example, ALD precursors that contain at least one metal-oxygen bond may have a lower deposition rate than those that contain only metal-nitrogen bonds.

The deposition rate may be reduced by selecting an ALD precursor that includes "bulky" ligands. As used herein, "bulky ligands" will be understood to include cyclic hydrocarbons, heterocyclic compounds, linear or branched hydrocarbons with more than three carbon atoms, amines with large groups, and alkoxides with large groups. As used herein, "large groups" will be understood to include cyclic hydrocarbons, or linear or branched hydrocarbons with more than three carbon atoms. Examples of cyclic hydrocarbons include cyclopentadienyl (Cp) substituted with five methyl groups (Cp-Me$_5$), benzene, and cycloheptatriene. Each of the cyclic hydrocarbons can include one or more substituents such as hydrogen, methyl, iso-propyl, tert-butyl, hydroxyl, amino groups, oxygen, etc. Examples of heterocyclic compounds include pyrrol, furan, and other cyclic compounds wherein one of the carbon atoms in the ring is substituted with nitrogen, oxygen, or sulfur. Each of the heterocyclic compounds can include one or more substituents such as hydrogen, methyl, iso-propyl, tert-butyl, hydroxyl, amino groups, oxygen, etc. Examples of linear or branched hydrocarbons with more than three carbon atoms include iso-propyl, tert-butyl, etc. Each of the linear or branched hydrocarbons can include one or more substituents such as hydrogen, methyl, hydroxyl, amino groups, oxygen, etc. Examples of amines with large groups include N—R$_2$, where R is a bulky group such as phenyl, iso-propyl, tert-butyl, etc. The two R-groups may be the same or may be different. Examples of alkoxides with large groups include O—C—R$_2$, where R is a bulky group such as phenyl, iso-propyl, tert-butyl, etc. The two R-groups may be the same or may be different. Any combination of the various classes of compounds may be attached to the metal. As an example, the precursor can be written with the general formula M(bulky)$_x$(alkoxide)$_y$, where M is the metal. When x+y=2, then metals such as strontium, barium, etc. can be used as the metal. When x+y=3, then metals such as aluminum, yttrium gallium, etc. can be used as the metal. When x+y=4, then metals such as titanium, zirconium, hafnium, molybdenum, germanium, tin, etc. can be used as the metal. When x+y=5, then metals such as tantalum, niobium, etc. can be used as the metal.

The bulky ligands create steric hindrance that blocks neighboring active sites for deposition. These blocked active sites are no longer available for deposition of the film. Therefore, the effective deposition rate of the film is decreased. As an example, ALD precursors that contain at least one metal-bulky ligand bond may have a lower deposition rate than those that contain only metal-small molecule bonds.

The benefits of the combination of the metal-oxygen bond and the bulky ligand in the same precursor can be illustrated with an example. TEMAT (tetrakis(ethylmethylamido)) titanium (Ti[N(C$_2$H$_5$)—(CH$_3$)]$_4$) is a common amine-based precursor used for the deposition of titanium-containing films using ALD. TEMAT does not have a metal-oxygen bond and does not have a "bulky ligand" (i.e. as defined above and as used herein). The deposition temperature is typically between 200 C and 300 C, and preferably in the range of about 250 C to 280 C. To deposit titanium oxide, ozone is used as the reactant. The ALD deposition process uses a generic sequence (i.e. precursor pulse-purge-oxidant pulse-purge-repeat) that is known in the art. The ozone concentration may vary from 3% to 20%. In one example, a titanium oxide film may be deposited using TEMAT at 260 C using 20% ozone as the reactant. Under these conditions, the deposition rate is about 1.13 A/cycle. Therefore, only a single ALD cycle would be used to form a layer having a thickness of 1 A. The uniformity across the substrate (e.g. a 300 mm wafer) is about 11% 1-sigma. The run-to-run repeatability for this precursor with respect to thickness can have a standard deviation of about 0.61.

An example of a titanium precursor that illustrates the benefits of the combination of the metal-oxygen bond and the bulky ligand in the same precursor is pentamethylcyclopentadieneyltitanium-trimethoxide ([C$_5$(CH$_3$)$_5$]Ti(OCH$_3$)$_3$). Those skilled in the art will understand that this precursor has three metal-oxygen bonds and also contains a "bulky ligand" (e.g. [C$_5$(CH$_3$)$_5$]) consistent with the definition given previously. This precursor may also be used to deposit titanium-containing films using ALD. The temperature is typically between 200 C and 350 C. To deposit titanium oxide, ozone is used as the reactant. The ALD deposition process uses a generic sequence (i.e. precursor pulse-purge-oxidant pulse-purge-repeat) that is known in the art. One cycle is defined by four steps from the precursor pulse to the oxidant purge. The ozone concentration may vary from 3% to 20%. In one example, a titanium oxide film may be deposited using this precursor at 260 C using 20% ozone as the reactant. Under these conditions, the deposition rate is about 0.47 A/cycle. Therefore, two ALD cycles would be used to form a layer having a thickness of 1 A. The deposition rate may be even lower at lower temperatures (e.g. less than 200 C), approaching 0.25 A/cycle. The uniformity across the substrate (e.g. a 300 mm wafer) is about 0.7% 1-sigma. The run-to-run repeatability for this precursor with respect to thickness can have a standard deviation of about 0.45. The lower deposition rate, improved uniformity, and improved run-to-run repeatability clearly demonstrate the benefits of the combination of the metal-oxygen bond and the bulky ligand in the same precursor.

The deposition rate of the flash layer and/or capping layer can also be decreased by altering the parameters of the ALD process. The deposition rate may decrease at lower temperatures and pressures. The deposition rate may decrease if less reactive oxidant species such as water or oxygen are used in place of more aggressive oxidant species such as ozone. If ozone is used as the oxidant, the deposition rate may decrease when reducing the ozone concentration. The deposition rate may decrease if shorter pulse times are used for the precursor pulse since this may result in an adsorbed layer with decreased coverage. The deposition rate may decrease when reducing the precursor flow to carrier flow ratio (e.g. reduce the total amount of precursor delivered into the reactor). These techniques may be combined with the bulky ligands discussed previously to develop an ALD process that has a very low deposition rate, leading to increased control and robustness for the deposition of very thin films (i.e. less than 10 A). In some embodiments, a combination of the process conditions discussed previously (e.g. temperature, pressure, precursor metal-oxygen bonding, precursor metal-bulky ligand bonding, oxidant composition, pulse times, and precursor flow) are selected to yield a deposition rate of less than 0.5 A/cycle. In some embodiments, the process conditions are selected to yield a deposition rate of less than 0.3 A/cycle.

FIG. 1 describes a method, 100, for fabricating a DRAM capacitor stack. The capacitor stack includes a first electrode layer, a dielectric layer, and a second electrode layer. The initial step, 102, involves forming a first electrode layer on a substrate. Examples of suitable electrode layers include metals, metal alloys, conductive metal oxides, conductive metal silicides, conductive metal nitrides, or combinations thereof. Two particularly interesting classes of materials are the conductive metal oxides and the conductive metal nitrides. In some embodiments, the first electrode layer includes one of ruthenium, platinum, titanium nitride, tantalum nitride, titanium-aluminum-nitride, tungsten, tungsten nitride, molybdenum, molybdenum nitride, or vanadium nitride. The first electrode layer may be a single layer or may be formed from multiple layers. Optionally, the first electrode layer can then be subjected to an annealing process (not shown). If the first electrode layer is a conductive metal nitride material, then the first electrode layer may be annealed using a Rapid Thermal Anneal (RTA) technique or furnace anneal technique. For the RTA case, the temperature is quickly raised in the presence of a nitrogen containing gas such as nitrogen, forming gas, ammonia, etc. Examples of such electrode treatment steps are further described in U.S. application Ser. No. 13/051,531 filed on Mar. 18, 2011, which is incorporated herein by reference for all purposes. Alternatively, if the first electrode is a conductive metal oxide, then the first electrode layer may be annealed in an inert or reducing atmosphere such as argon, nitrogen, or forming gas. Examples of such an annealing process is further described in U.S. application Ser. No. 13/084,666 filed on Apr. 12, 2011, entitled "METHOD FOR FABRICATING A DRAM CAPACITOR" which is incorporated herein by reference for all purposes.

The next step, 104, involves forming a flash layer above the first electrode layer. In the case of a metal oxide flash layer, the flash layer may be formed using an ALD technique wherein the metal precursor contains at least one metal-oxygen bond and wherein the metal precursor contains at least one metal-bulky ligand bond. The flash layer typically has a thickness between 1 A and 10 A. The next step, 106, includes forming a dielectric layer above the flash layer. The dielectric layer may be a single layer or may be formed from multiple layers. The dielectric layer may include a dopant. As used herein, the dopant may be electrically active or not electrically active. The definition of a "dopant" excludes residues and impurities such as carbon, etc. that may be present in the material due to inefficiencies of the process or impurities in the precursor materials.

The crystalline phases of dielectric materials exhibit higher k values than their amorphous phases. Therefore, there is often an optional anneal step either after the dielectric formation step (also known as a post dielectric anneal (PDA)) or an anneal step after the formation of the second electrode (also known as a post metallization anneal (PMA)) to crystallize at least a portion of the dielectric layer. Examples of the PDA and PMA treatments are further described in U.S. application Ser. No. 13/159,842 filed on Jun. 14, 2011, entitled "METHOD OF PROCESSING MIM CAPACITORS TO REDUCE LEAKAGE CURRENT" which is incorporated herein by reference for all purposes.

The next step, 108, involves forming a second electrode layer above the dielectric layer to form a capacitor stack. The second electrode layer may be a single layer or may be formed from multiple layers. In some embodiments, the second electrode layer includes one of ruthenium, platinum, titanium nitride, tantalum nitride, titanium-aluminum-nitride, tungsten, tungsten nitride, molybdenum, molybdenum nitride, or vanadium nitride. Typically, the capacitor stack can then be subjected to a PMA annealing process (not shown) as discussed previously.

Figure 2:
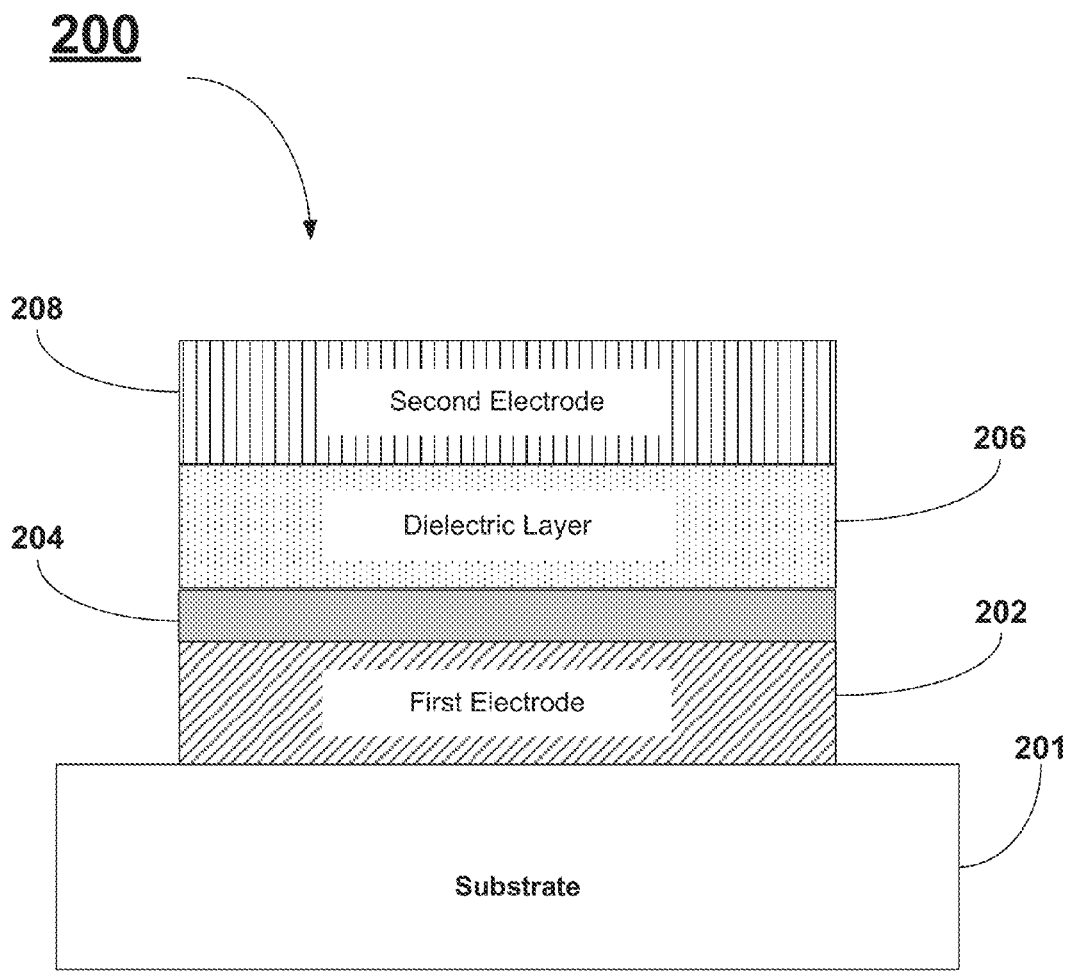
FIG. 2 illustrates a simplified cross-sectional view of a DRAM capacitor stack fabricated in accordance with some embodiments.

FIG. 2 illustrates a simplified cross-sectional view of a DRAM capacitor stack, 200, fabricated in accordance with some embodiments. The capacitor stack includes a first electrode layer, a dielectric layer, and a second electrode layer. The capacitor stack may include other layers as well. In some embodiments, the dielectric layer includes zirconium oxide. The zirconium oxide may further include a dopant. Suitable dopants for use with zirconium oxide dielectric layers include Al, Ce, Co, Er, Ga, Gd, Ge, Hf, La, Mg, Si, Sn, Sr, Ti, Y, or combinations thereof. However, those skilled in the art will understand that the present methods may be applied to many dielectric layers. Examples of suitable dielectric layers include aluminum oxide, barium-strontium-titanate (BST), hafnium oxide, hafnium silicate, niobium oxide, lead-zirconium-titanate (PZT), a bilayer of silicon oxide and silicon nitride, silicon oxy-nitride, strontium-titanate (STO), tantalum oxide, titanium oxide, zirconium oxide, or combinations thereof. These dielectric layers may also include dopants.

First electrode layer, 202, is formed above substrate, 201. Generally, the substrate was subjected to one or more processing steps in the manufacture of a full DRAM device. The first electrode layer may be a single layer or may be formed from multiple layers. First electrode layer, 202, includes one of metals, metal alloys, conductive metal oxides, conductive metal nitrides, conductive metal silicides, conductive metal carbides, etc. In some embodiments, the first electrode layer includes one of ruthenium, platinum, titanium nitride, tantalum nitride, titanium-aluminum-nitride, tungsten, tungsten nitride, molybdenum, molybdenum nitride, or vanadium nitride. For this example, first electrode layer, 202, includes a conductive metal nitride. Examples of such conductive metal nitrides include the conductive compounds of cobalt nitride, molybdenum nitride, nickel nitride, tantalum nitride, titanium nitride, titanium aluminum nitride, tungsten nitride, or combinations thereof. A specific electrode layer of interest is titanium nitride when zirconium oxide is used as the dielectric layer. The titanium nitride is typically formed using PVD, PECVD, CVD, or ALD as discussed previously. The titanium nitride first electrode layer may optionally receive an RTA anneal treatment before the formation of the oxygen donor layer as discussed previously.

Flash layer, 204, is formed above first electrode layer, 202. Flash layer, 204, includes one of metal oxides, metal nitrides, metal silicides, metal carbides, etc. In some embodiments, flash layer, 204, includes a metal oxide. The metal oxide may be formed using an ALD technique wherein the metal precursor contains at least one metal-oxygen bond and wherein the metal precursor contains at least one metal-bulky ligand bond. The flash layer typically has a thickness between 1 A and 10 A. The flash layer may be deposited using an ALD process at a temperature between 200 C and 350 C. The ALD process may be performed at a pressure between 0.1 Torr and 2.0 Torr. The pulse time of the precursor pulse will typically be between 0.1 second and 180 seconds. Ozone is typically used as the reactant. A specific example of a metal oxide flash layer includes titanium oxide when zirconium oxide is used as the dielectric layer. Other metal oxides of interest include aluminum oxide, cerium oxide, europium oxide, gadolinium oxide, gallium oxide, germanium oxide, lanthanum oxide, molybdenum oxide, nickel oxide, ruthenium oxide, silicon oxide, tin oxide, and the like.

Dielectric layer, 206, is then formed above the flash layer. Suitable dielectric layers include at least one of aluminum oxide, barium-strontium-titanate (BST), hafnium oxide, hafnium silicate, niobium oxide, lead-zirconium-titanate (PZT), a bilayer of silicon oxide and silicon nitride, silicon oxy-nitride, strontium-titanate (STO), tantalum oxide, titanium oxide, zirconium oxide, or combinations thereof. The dielectric layer may be a single layer or may be formed from multiple layers. In some embodiments, the dielectric layer includes zirconium oxide. The zirconium oxide may further include a dopant. Suitable dopants for use with zirconium oxide dielectric layers include Al, Ce, Co, Er, Eu, F, Ga, Gd, Ge, Hf, La, Mg, N, Si, Sn, Sr, Ti, Y, or combinations thereof.

Second electrode layer, 208, is then formed above the dielectric layer to form a capacitor stack. The second electrode layer may be a single layer or may be formed from multiple layers. Second electrode layer, 208, includes one of metals, metal alloys, conductive metal oxides, conductive metal nitrides, conductive metal silicides, conductive metal carbides, etc. In some embodiments, the first electrode layer includes one of ruthenium, platinum, titanium nitride, tantalum nitride, titanium-aluminum-nitride, tungsten, tungsten nitride, molybdenum, molybdenum nitride, or vanadium nitride. For this example, second electrode layer, 208, includes a conductive metal nitride. Examples of such conductive metal nitrides include the conductive compounds of cobalt nitride, molybdenum nitride, nickel nitride, tantalum nitride, titanium nitride, titanium aluminum nitride, tungsten nitride, or combinations thereof. A specific electrode layer of interest is titanium nitride when zirconium oxide is used as the dielectric layer. The titanium nitride is typically formed using PVD, PECVD, CVD, or ALD. The capacitor stack may receive a PMA treatment as discussed previously.

Figure 3:
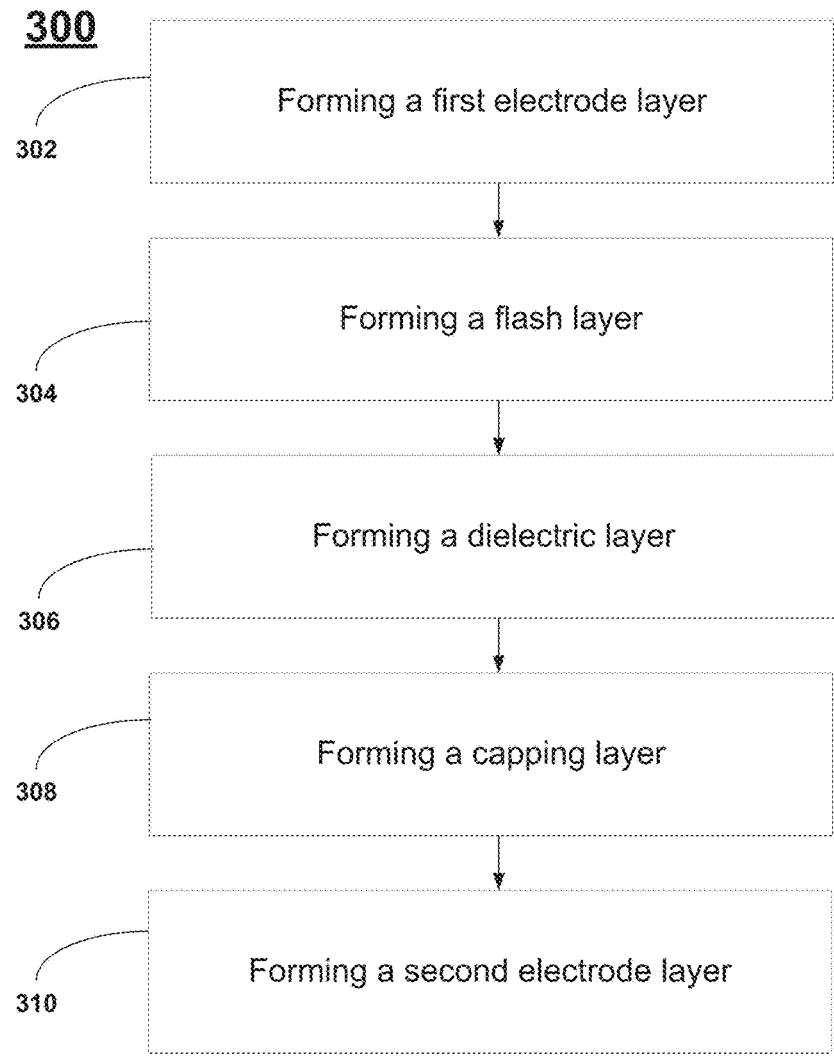
FIG. 3 illustrates a flow chart describing a method for fabricating a DRAM capacitor stack in accordance with some embodiments.

FIG. 3 describes a method, 300, for fabricating a DRAM capacitor stack. The capacitor stack includes a first electrode layer, a dielectric layer, and a second electrode layer. The initial step, 302, involves forming a first electrode layer on a substrate. Examples of suitable electrode layers include metals, metal alloys, conductive metal oxides, conductive metal silicides, conductive metal nitrides, or combinations thereof. In some embodiments, the first electrode layer includes one of ruthenium, platinum, titanium nitride, tantalum nitride, titanium-aluminum-nitride, tungsten, tungsten nitride, molybdenum, molybdenum nitride, or vanadium nitride. Two particularly interesting classes of materials are the conductive metal oxides and the conductive metal nitrides. The first electrode may be a single layer or may be formed from multiple layers. Optionally, the first electrode layer can then be subjected to an annealing process (not shown). If the first electrode layer is a conductive metal nitride material, then the first electrode layer may be annealed using a Rapid Thermal Anneal (RTA) technique or furnace anneal technique. For the RTA case, the temperature is quickly raised in the presence of a nitrogen containing gas such as nitrogen, forming gas, ammonia, etc. as discussed previously. Alternatively, if the first electrode is a conductive metal oxide, then the first electrode layer may be annealed in an inert or reducing atmosphere such as argon, nitrogen, or forming gas as discussed previously.

The next step, 304, involves forming a flash layer above the first electrode layer. In the case of a metal oxide flash layer, the flash layer may be formed using an ALD technique wherein the metal precursor contains at least one metal-oxygen bond and wherein the metal precursor contains at least one metal-bulky ligand bond. The flash layer typically has a thickness between 1 A and 10 A.

The next step, 306, includes forming a dielectric layer above the flash layer. The dielectric layer may be a single layer or may be formed from multiple layers. The dielectric layer may include a dopant. The dielectric layer may be subjected to a PDA treatment as discussed previously.

The next step, 308, involves forming a capping layer above the dielectric layer. In the case of a metal oxide capping layer, the capping layer may be formed using an ALD technique wherein the metal precursor contains at least one metal-oxygen bond and wherein the metal precursor contains at least one metal-bulky ligand bond. The capping layer typically has a thickness between 1 A and 15 A.

The next step, 310, involves forming a second electrode layer above the capping layer to form a capacitor stack. The second electrode layer may be a single layer or may be formed from multiple layers. In some embodiments, the first electrode layer includes one of ruthenium, platinum, titanium nitride, tantalum nitride, titanium-aluminum-nitride, tungsten, tungsten nitride, molybdenum, molybdenum nitride, or vanadium nitride. Typically, the capacitor stack can then be subjected to a PMA annealing process (not shown) as discussed previously.

Figure 4:
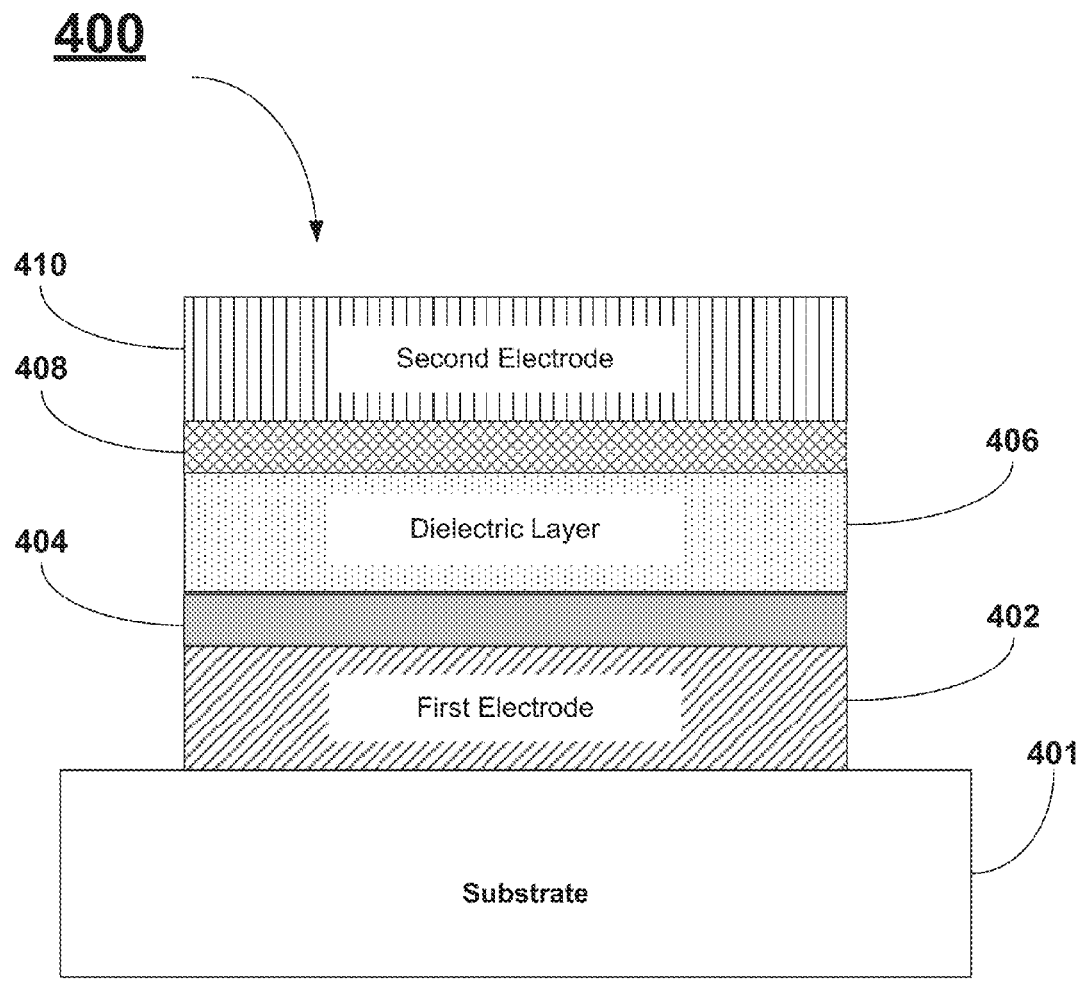
FIG. 4 illustrates a simplified cross-sectional view of a DRAM capacitor stack fabricated in accordance with some embodiments.

FIG. 4 illustrates a simplified cross-sectional view of a DRAM capacitor stack, 400, fabricated in accordance with some embodiments. The capacitor stack includes a first electrode layer, a dielectric layer, and a second electrode layer. The capacitor stack may include other layers as well. In some embodiments, the dielectric layer includes zirconium oxide. The zirconium oxide may further include a dopant. Suitable dopants for use with zirconium oxide dielectric layers include Al, Ce, Co, Er, Eu, F, Ga, Gd, Ge, Hf, La, Mg, N, Si, Sn, Sr, Ti, Y, or combinations thereof. However, those skilled in the art will understand that the present methods may be applied to many dielectric layers. Examples of suitable dielectric layers include aluminum oxide, barium-strontium-titanate (BST), hafnium oxide, hafnium silicate, niobium oxide, lead-zirconium-titanate (PZT), a bilayer of silicon oxide and silicon nitride, silicon oxy-nitride, strontium-titanate (STO), tantalum oxide, titanium oxide, zirconium oxide, or combinations thereof. These dielectric layers may also include dopants.

First electrode layer, 402, is formed above substrate, 401. Generally, the substrate was subjected to one or more processing steps in the manufacture of a full DRAM device. The first electrode layer may be a single layer or may be formed from multiple layers. First electrode layer, 402, includes one of metals, metal alloys, conductive metal oxides, conductive metal nitrides, conductive metal silicides, conductive metal carbides, etc. In some embodiments, the first electrode layer includes one of ruthenium, platinum, titanium nitride, tantalum nitride, titanium-aluminum-nitride, tungsten, tungsten nitride, molybdenum, molybdenum nitride, or vanadium nitride. For this example, first electrode layer, 402, includes a conductive metal nitride. Examples of such conductive metal nitrides include the conductive compounds of cobalt nitride, molybdenum nitride, nickel nitride, tantalum nitride, titanium nitride, titanium aluminum nitride, tungsten nitride, or combinations thereof. A specific electrode layer of interest is titanium nitride when zirconium oxide is used as the dielectric layer. The titanium nitride is typically formed using PVD, PECVD, CVD, or ALD as discussed previously. The titanium nitride first electrode layer may optionally receive an RTA anneal treatment before the formation of the oxygen donor layer as discussed previously.

Flash layer, 404, is formed above first electrode layer, 402. Flash layer, 404, includes one of metal oxides, metal nitrides, metal silicides, metal carbides, etc. In some embodiments, flash layer, 404, includes a metal oxide. The metal oxide may be formed using an ALD technique wherein the metal precursor contains at least one metal-oxygen bond and wherein the metal precursor contains at least one metal-bulky ligand bond. The flash layer may be deposited using an ALD process at a temperature between 200 C and 350 C. The ALD process may be performed at a pressure between 0.1 Torr and 2.0 Torr. The pulse time of the precursor pulse will typically be between 0.1 second and 180 seconds. Ozone is typically used as the reactant. The flash layer typically has a thickness between 1 A and 10 A. A specific example of a metal oxide flash layer includes titanium oxide when zirconium oxide is used as the dielectric layer. Other metal oxides of interest include aluminum oxide, cerium oxide, europium oxide, gadolinium oxide, gallium oxide, germanium oxide, lanthanum oxide, molybdenum oxide, nickel oxide, ruthenium oxide, silicon oxide, tin oxide, and the like.

Dielectric layer, 406, is then formed above the flash layer. Suitable dielectric layers include at least one of aluminum oxide, barium-strontium-titanate (BST), hafnium oxide, hafnium silicate, niobium oxide, lead-zirconium-titanate (PZT), a bilayer of silicon oxide and silicon nitride, silicon oxy-nitride, strontium-titanate (STO), tantalum oxide, titanium oxide, zirconium oxide, or combinations thereof. The dielectric layer may be a single layer or may be formed from multiple layers. In some embodiments, the dielectric layer includes zirconium oxide. The zirconium oxide may further include a dopant. Suitable dopants for use with zirconium oxide dielectric layers include Al, Ce, Co, Er, Eu, F, Ga, Gd, Ge, Hf, La, Mg, N, Si, Sn, Sr, Ti, Y, or combinations thereof.

Capping layer, 408, is formed above dielectric layer, 406. Capping layer, 408, includes one of metal oxides, metal nitrides, metal silicides, metal carbides, etc. In some embodiments, capping layer, 408, includes a metal oxide. The metal oxide may be formed using an ALD technique wherein the metal precursor contains at least one metal-oxygen bond and wherein the metal precursor contains at least one metal-bulky ligand bond. The capping layer may be deposited using an ALD process at a temperature between 200 C and 350 C. The ALD process may be performed at a pressure between 0.1 Torr and 2.0 Torr. The pulse time of the precursor pulse will typically be between 0.1 second and 180 seconds. Ozone is typically used as the reactant. The capping layer typically has a thickness between 1 A and 15 A. A specific example of a metal oxide capping layer includes titanium oxide when zirconium oxide is used as the dielectric layer. Other metal oxides of interest include aluminum oxide, cerium oxide, europium oxide, gadolinium oxide, gallium oxide, germanium oxide, lanthanum oxide, molybdenum oxide, nickel oxide, ruthenium oxide, silicon oxide, tin oxide, and the like.

Second electrode layer, 410, is then formed above the capping layer to form a capacitor stack. The second electrode layer may be a single layer or may be formed from multiple layers. Second electrode layer, 410, includes one of metals, metal alloys, conductive metal oxides, conductive metal nitrides, conductive metal silicides, conductive metal carbides, etc. In some embodiments, the first electrode layer includes one of ruthenium, platinum, titanium nitride, tantalum nitride, titanium-aluminum-nitride, tungsten, tungsten nitride, molybdenum, molybdenum nitride, or vanadium nitride. For this example, second electrode layer, 410, includes a conductive metal nitride. Examples of such conductive metal nitrides include the conductive compounds of cobalt nitride, molybdenum nitride, nickel nitride, tantalum nitride, titanium nitride, titanium aluminum nitride, tungsten nitride, or combinations thereof. A specific electrode layer of interest is titanium nitride when zirconium oxide is used as the dielectric layer. The titanium nitride is typically formed using PVD, PECVD, CVD, or ALD. The capacitor stack may receive a PMA treatment as discussed previously.

Figure 5:
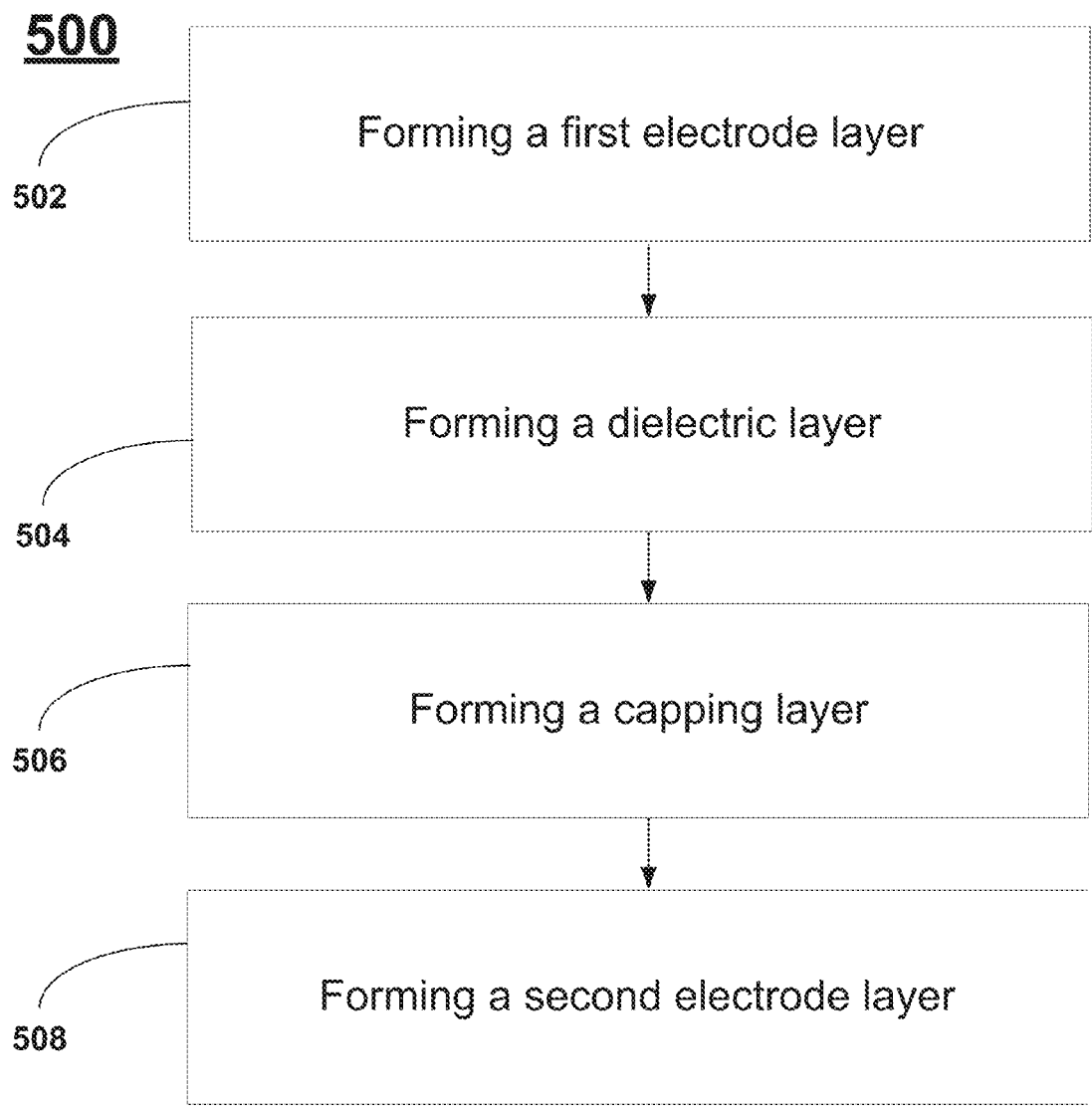
FIG. 5 illustrates a flow chart describing a method for fabricating a DRAM capacitor stack in accordance with some embodiments.

FIG. 5 describes a method, 500, for fabricating a DRAM capacitor stack. The capacitor stack includes a first electrode layer, a dielectric layer, and a second electrode layer. The initial step, 502, involves forming a first electrode layer on a substrate. Examples of suitable electrode layers include metals, metal alloys, conductive metal oxides, conductive metal silicides, conductive metal nitrides, or combinations thereof. In some embodiments, the first electrode layer includes one of ruthenium, platinum, titanium nitride, tantalum nitride, titanium-aluminum-nitride, tungsten, tungsten nitride, molybdenum, molybdenum nitride, or vanadium nitride. Two particularly interesting classes of materials are the conductive metal oxides and the conductive metal nitrides. The first electrode may be a single layer or may be formed from multiple layers. Optionally, the first electrode layer can then be subjected to an annealing process (not shown). If the first electrode layer is a conductive metal nitride material, then the first electrode layer may be annealed using a Rapid Thermal Anneal (RTA) technique or furnace anneal technique. For the RTA case, the temperature is quickly raised in the presence of a nitrogen containing gas such as nitrogen, forming gas, ammonia, etc. as discussed previously. Alternatively, if the first electrode is a conductive metal oxide, then the first electrode layer may be annealed in an inert or reducing atmosphere such as argon, nitrogen, or forming gas as discussed previously.

The next step, 504, includes forming a dielectric layer above the first electrode layer. The dielectric layer may be a single layer or may be formed from multiple layers. The dielectric layer may include a dopant. The dielectric layer may be subjected to a PDA treatment as discussed previously.

The next step, 506, involves forming a capping layer above the dielectric layer. In the case of a metal oxide capping layer, the capping layer may be formed using an ALD technique wherein the metal precursor contains at least one metal-oxygen bond and wherein the metal precursor contains at least one metal-bulky ligand bond. The capping layer typically has a thickness between 1 A and 15 A.

The next step, 508, involves forming a second electrode layer above the capping layer to form a capacitor stack. The second electrode layer may be a single layer or may be formed from multiple layers. In some embodiments, the first electrode layer includes one of ruthenium, platinum, titanium nitride, tantalum nitride, titanium-aluminum-nitride, tungsten, tungsten nitride, molybdenum, molybdenum nitride, or vanadium nitride. Typically, the capacitor stack can then be subjected to a PMA annealing process (not shown) as discussed previously.

Figure 6:
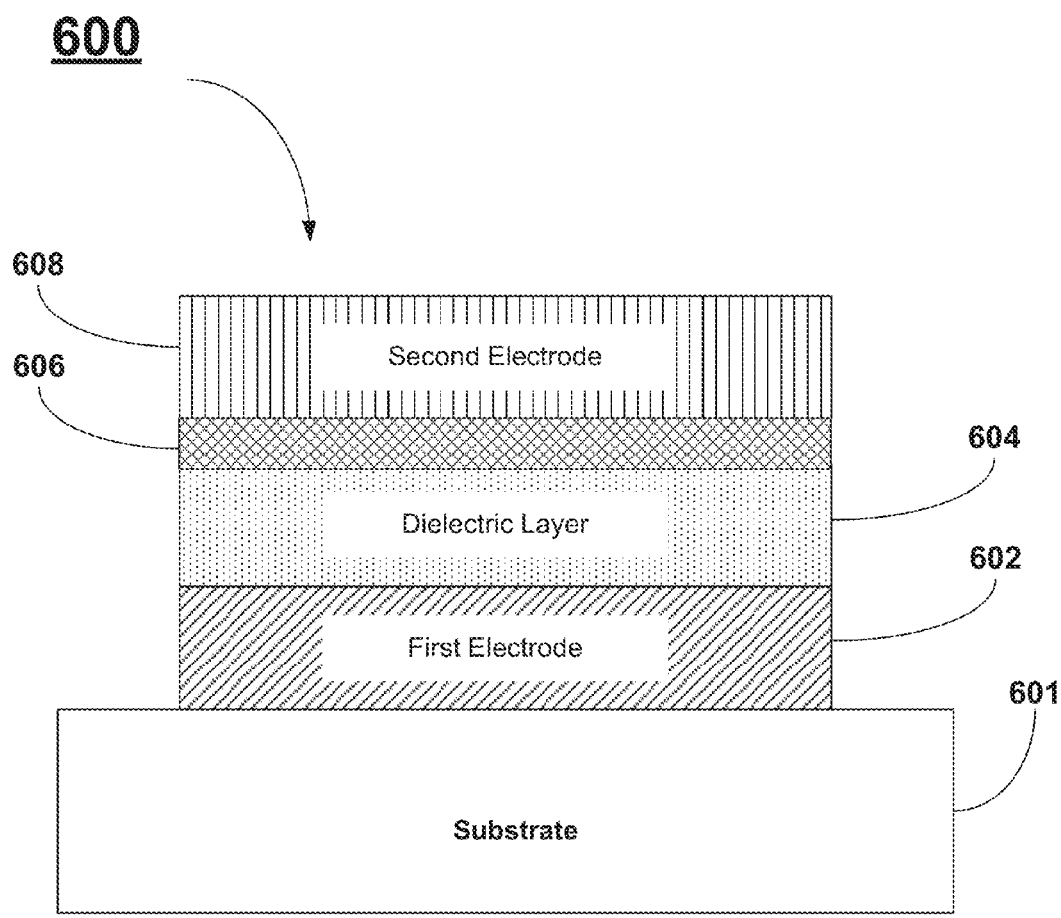
FIG. 6 illustrates a simplified cross-sectional view of a DRAM capacitor stack fabricated in accordance with some embodiments.

FIG. 6 illustrates a simplified cross-sectional view of a DRAM capacitor stack, 600, fabricated in accordance with some embodiments. The capacitor stack includes a first electrode layer, a dielectric layer, and a second electrode layer. The capacitor stack may include other layers as well. In some embodiments, the dielectric layer includes zirconium oxide. The zirconium oxide may further include a dopant. Suitable dopants for use with zirconium oxide dielectric layers include Al, Ce, Co, Er, Eu, F, Ga, Gd, Ge, Hf, La, Mg, N, Si, Sn, Sr, Ti, Y, or combinations thereof. However, those skilled in the art will understand that the present methods may be applied to many dielectric layers. Examples of suitable dielectric layers include aluminum oxide, barium-strontium-titanate (BST), hafnium oxide, hafnium silicate, niobium oxide, lead-zirconium-titanate (PZT), a bilayer of silicon oxide and silicon nitride, silicon oxy-nitride, strontium-titanate (STO), tantalum oxide, titanium oxide, zirconium oxide, or combinations thereof. These dielectric layers may also include dopants.

First electrode layer, 602, is formed above substrate, 601. Generally, the substrate was subjected to one or more processing steps in the manufacture of a full DRAM device. The first electrode layer may be a single layer or may be formed from multiple layers. First electrode layer, 602, includes one of metals, metal alloys, conductive metal oxides, conductive metal nitrides, conductive metal silicides, conductive metal carbides, etc. In some embodiments, the first electrode layer includes one of ruthenium, platinum, titanium nitride, tantalum nitride, titanium-aluminum-nitride, tungsten, tungsten nitride, molybdenum, molybdenum nitride, or vanadium nitride. For this example, first electrode layer, 602, includes a conductive metal nitride. Examples of such conductive metal nitrides include the conductive compounds of cobalt nitride, molybdenum nitride, nickel nitride, tantalum nitride, titanium nitride, titanium aluminum nitride, tungsten nitride, or combinations thereof. A specific electrode layer of interest is titanium nitride when zirconium oxide is used as the dielectric layer. The titanium nitride is typically formed using PVD, PECVD, CVD, or ALD as discussed previously. The titanium nitride first electrode layer may optionally receive an RTA anneal treatment before the formation of the oxygen donor layer as discussed previously.

Dielectric layer, 604, is then formed above the first electrode layer. Suitable dielectric layers include at least one of aluminum oxide, barium-strontium-titanate (BST), hafnium oxide, hafnium silicate, niobium oxide, lead-zirconium-titanate (PZT), a bilayer of silicon oxide and silicon nitride, silicon oxy-nitride, strontium-titanate (STO), tantalum oxide, titanium oxide, zirconium oxide, or combinations thereof. The dielectric layer may be a single layer or may be formed from multiple layers. In some embodiments, the dielectric layer includes zirconium oxide. The zirconium oxide may further include a dopant. Suitable dopants for use with zirconium oxide dielectric layers include Al, Ce, Co, Er, Eu, F, Ga, Gd, Ge, Hf, La, Mg, N, Si, Sn, Sr, Ti, Y, or combinations thereof.

Capping layer, 606, is formed above dielectric layer, 604. Capping layer, 606, includes one of metal oxides, metal nitrides, metal silicides, metal carbides, etc. In some embodiments, capping layer, 606, includes a metal oxide. The metal oxide may be formed using an ALD technique wherein the metal precursor contains at least one metal-oxygen bond and wherein the metal precursor contains at least one metal-bulky ligand bond. The capping layer may be deposited using an ALD process at a temperature between 200 C and 350 C. The ALD process may be performed at a pressure between 0.1 Torr and 2.0 Torr. The pulse time of the precursor pulse will typically be between 0.1 second and 180 seconds. Ozone is typically used as the reactant. The capping layer typically has a thickness between 1 A and 15 A. A specific example of a metal oxide capping layer includes titanium oxide when zirconium oxide is used as the dielectric layer. Other metal oxides of interest include aluminum oxide, cerium oxide, europium oxide, gadolinium oxide, gallium oxide, germanium oxide, lanthanum oxide, molybdenum oxide, nickel oxide, ruthenium oxide, silicon oxide, tin oxide, and the like.

Second electrode layer, 608, is then formed above the capping layer to form a capacitor stack. The second electrode layer may be a single layer or may be formed from multiple layers. Second electrode layer, 608, includes one of metals, metal alloys, conductive metal oxides, conductive metal nitrides, conductive metal silicides, conductive metal carbides, etc. In some embodiments, the first electrode layer includes one of ruthenium, platinum, titanium nitride, tantalum nitride, titanium-aluminum-nitride, tungsten, tungsten nitride, molybdenum, molybdenum nitride, or vanadium nitride. For this example, second electrode layer, 608, includes a conductive metal nitride. Examples of such conductive metal nitrides include the conductive compounds of cobalt nitride, molybdenum nitride, nickel nitride, tantalum nitride, titanium nitride, titanium aluminum nitride, tungsten nitride, or combinations thereof. A specific electrode layer of interest is titanium nitride when zirconium oxide is used as the dielectric layer. The titanium nitride is typically formed using PVD, PECVD, CVD, or ALD. The capacitor stack may receive a PMA treatment as discussed previously.

Figure 7:
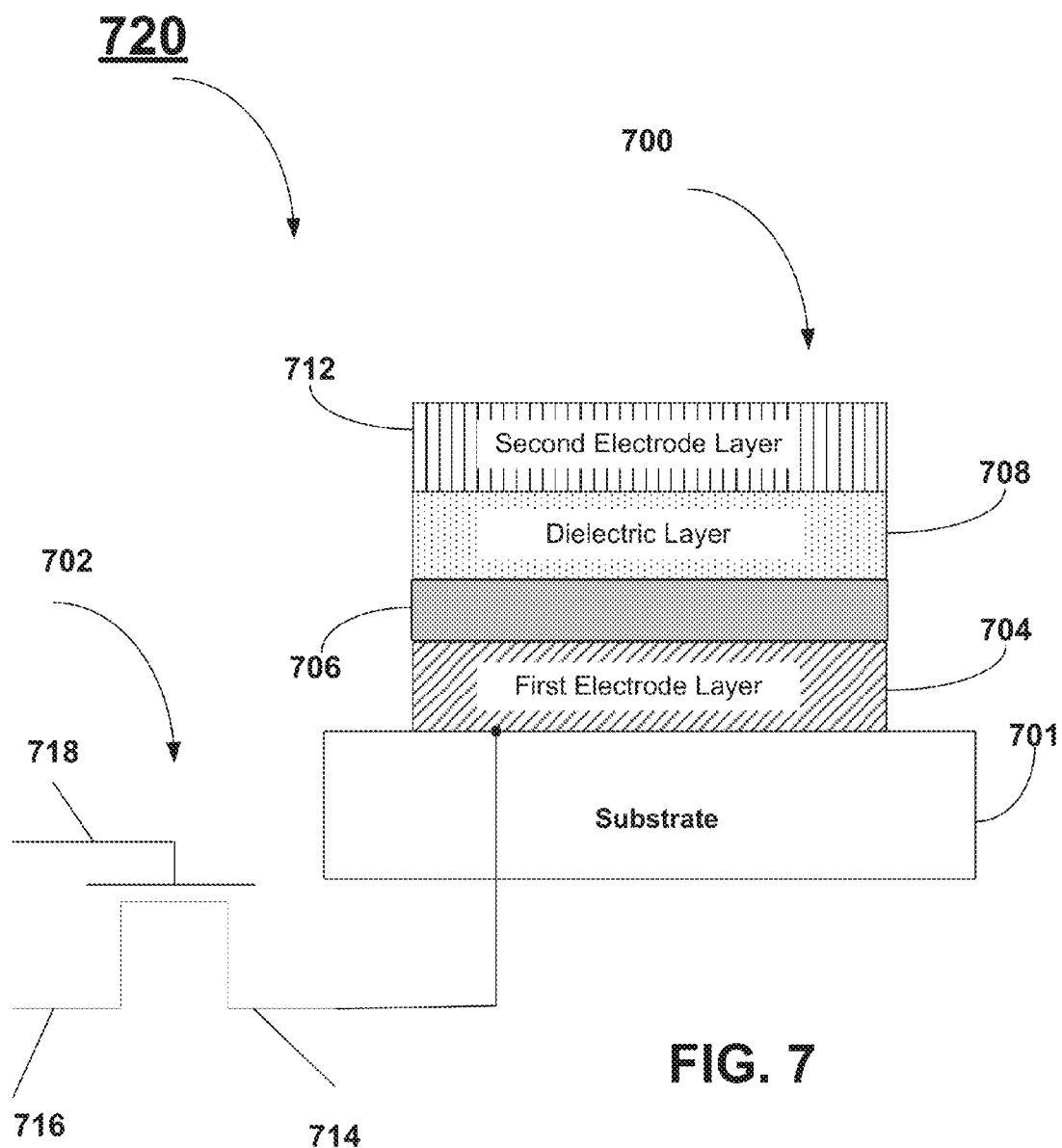
FIG. 7 illustrates a simplified cross-sectional view of a DRAM memory cell fabricated in accordance with some embodiments.

An example of a specific application of some embodiments is in the fabrication of capacitors used in the memory cells in DRAM devices. DRAM memory cells effectively use a capacitor to store charge for a period of time, with the charge being electronically "read" to determine whether a logical "one" or "zero" has been stored in the associated cell. Conventionally, a cell transistor is used to access the cell. The cell transistor is turned "on" in order to store data on each associated capacitor and is otherwise turned "off" to isolate the capacitor and preserve its charge. More complex DRAM cell structures exist, but this basic DRAM structure will be used for illustrating the application of this disclosure to capacitor manufacturing and to DRAM manufacturing. FIG. 7 is used to illustrate one DRAM cell, 720, manufactured using a structure as discussed previously in reference to FIG. 2. The cell, 720, is illustrated schematically to include two principle components, a cell capacitor, 700, and a cell transistor, 702. The cell transistor is usually constituted by a MOS transistor having a gate, 718, source, 714, and drain, 716. The gate is usually connected to a word line and one of the source or drain is connected to a bit line. The cell capacitor, 700, has a lower or storage electrode, 704, and an upper or plate electrode, 712. The storage electrode is connected to the other of the source or drain and the plate electrode is connected to a reference potential conductor. The cell transistor is, when selected, turned "on" by an active level of the word line to read or write data from or into the cell capacitor via the bit line.

FIG. 7 illustrates a simplified cross-sectional view of a DRAM cell fabricated in accordance with some embodiments. In some embodiments, the dielectric layer includes zirconium oxide. The zirconium oxide may further include a dopant. Suitable dopants for use with zirconium oxide dielectric layers include Al, Ce, Co, Er, Eu, F, Ga, Gd, Ge, Hf, La, Mg, N, Si, Sn, Sr, Ti, Y, or combinations thereof. However, those skilled in the art will understand that the present methods may be applied to many dielectric layers. Examples of suitable dielectric layers include aluminum oxide, barium-strontium-titanate (BST), hafnium oxide, hafnium silicate, niobium oxide, lead-zirconium-titanate (PZT), a bilayer of silicon oxide and silicon nitride, silicon oxy-nitride, strontium-titanate (STO), tantalum oxide, titanium oxide, zirconium oxide, or combinations thereof.

As was described previously, the cell capacitor, 700, includes a first electrode layer, 704, formed above substrate, 701. The first electrode layer, 704, is connected to the source or drain of the cell transistor, 702. For illustrative purposes, the first electrode has been connected to the source, 714, in this example. First electrode layer, 704, is formed above substrate, 701. Generally, the substrate has already received several processing steps in the manufacture of a full DRAM device. The first electrode layer may be a single layer or may be formed from multiple layers. First electrode layer, 704, includes one of metals, metal alloys, conductive metal oxides, conductive metal nitrides, conductive metal silicides, conductive metal carbides, etc. In some embodiments, the first electrode layer includes one of ruthenium, platinum, titanium nitride, tantalum nitride, titanium-aluminum-nitride, tungsten, tungsten nitride, molybdenum, molybdenum nitride, or vanadium nitride. For this example, first electrode layer, 704, includes a conductive metal nitride. Examples of such conductive metal nitrides include the conductive compounds of cobalt nitride, molybdenum nitride, nickel nitride, tantalum nitride, titanium nitride, titanium aluminum nitride, tungsten nitride, or combinations thereof. A specific electrode layer of interest is titanium nitride when zirconium oxide is used as the dielectric layer. The titanium nitride is typically formed using PVD, PECVD, CVD, or ALD. The TiN first electrode layer may optionally receive an RTA anneal treatment before the formation of the dielectric layer as discussed previously.

Flash layer, 706, is formed above first electrode layer, 704. Flash layer, 706, includes one of metal oxides, metal nitrides, metal silicides, metal carbides, etc. In some embodiments, flash layer, 706, includes a metal oxide. The metal oxide may be formed using an ALD technique wherein the metal precursor contains at least one metal-oxygen bond and wherein the metal precursor contains at least one metal-bulky ligand bond. The flash layer may be deposited using an ALD process at a temperature between 200 C and 350 C. The ALD process may be performed at a pressure between 0.1 Torr and 2.0 Torr. The pulse time of the precursor pulse will typically be between 0.1 second and 180 seconds. Ozone is typically used as the reactant. The flash layer typically has a thickness between 1 A and 10 A. A specific example of a metal oxide flash layer includes titanium oxide when zirconium oxide is used as the dielectric layer. Other metal oxides of interest include aluminum oxide, cerium oxide, europium oxide, gadolinium oxide, gallium oxide, germanium oxide, lanthanum oxide, molybdenum oxide, nickel oxide, ruthenium oxide, silicon oxide, tin oxide, and the like.

Dielectric layer, 708, is then formed above the flash layer. Suitable dielectric layers include at least one of aluminum oxide, barium-strontium-titanate (BST), hafnium oxide, hafnium silicate, niobium oxide, lead-zirconium-titanate (PZT), a bilayer of silicon oxide and silicon nitride, silicon oxy-nitride, strontium-titanate (STO), tantalum oxide, titanium oxide, zirconium oxide, or combinations thereof. The dielectric layer may be a single layer or may be formed from multiple layers. In some embodiments, the dielectric layer includes zirconium oxide. The zirconium oxide may further include a dopant. Suitable dopants for use with zirconium oxide dielectric layers include Al, Ce, Co, Er, Eu, F, Ga, Gd, Ge, Hf, La, Mg, N, Si, Sn, Sr, Ti, Y, or combinations thereof.

Second electrode layer, 712, is then formed above the dielectric layer to form a capacitor stack. The second electrode layer may be a single layer or may be formed from multiple layers. Second electrode layer, 712, includes one of metals, metal alloys, conductive metal oxides, conductive metal nitrides, conductive metal silicides, conductive metal carbides, etc. In some embodiments, the second electrode layer includes one of ruthenium, platinum, titanium nitride, tantalum nitride, titanium-aluminum-nitride, tungsten, tungsten nitride, molybdenum, molybdenum nitride, or vanadium nitride. For this example, second electrode layer, 712, includes a conductive metal nitride. Examples of such conductive metal nitrides include the conductive compounds of cobalt nitride, molybdenum nitride, nickel nitride, tantalum nitride, titanium nitride, titanium aluminum nitride, tungsten nitride, or combinations thereof. A specific electrode layer of interest is titanium nitride when zirconium oxide is used as the dielectric layer. The titanium nitride is typically formed using PVD, PECVD, CVD, or ALD. The capacitor stack may receive a PMA treatment as discussed previously.

Figure 8:
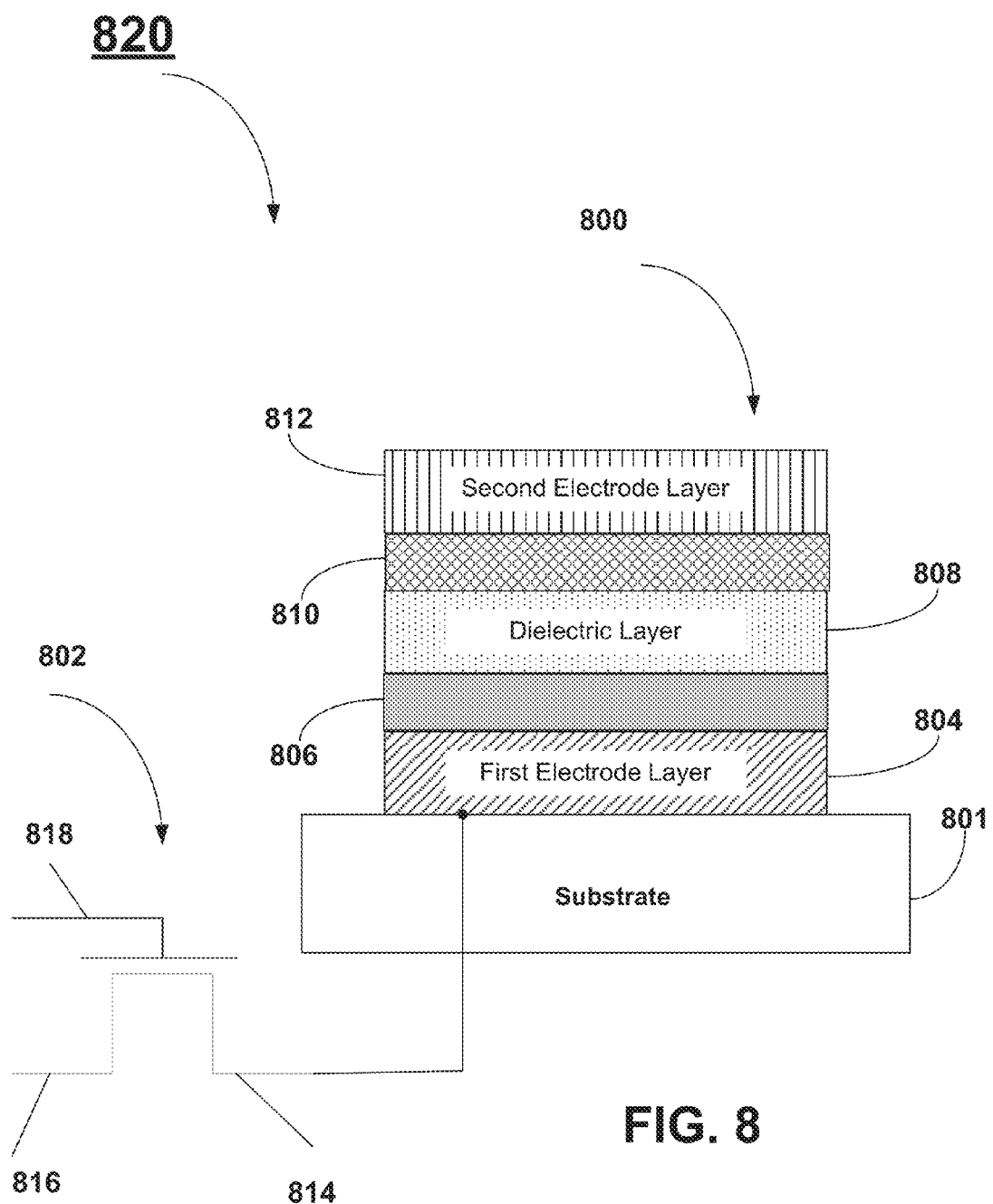
FIG. 8 illustrates a simplified cross-sectional view of a DRAM memory cell fabricated in accordance with some embodiments.

FIG. 8 is used to illustrate one DRAM cell, 820, manufactured using a structure as discussed previously in reference to FIG. 4. The cell, 820, is illustrated schematically to include two principle components, a cell capacitor, 800, and a cell transistor, 802. The cell transistor is usually constituted by a MOS transistor having a gate, 818, source, 814, and drain, 816. The gate is usually connected to a word line and one of the source or drain is connected to a bit line. The cell capacitor, 800, has a lower or storage electrode, 804, and an upper or plate electrode, 812. The storage electrode is connected to the other of the source or drain and the plate electrode is connected to a reference potential conductor. The cell transistor is, when selected, turned "on" by an active level of the word line to read or write data from or into the cell capacitor via the bit line.

FIG. 8 illustrates a simplified cross-sectional view of a DRAM cell fabricated in accordance with some embodiments. In some embodiments, the dielectric layer includes zirconium oxide. The zirconium oxide may further include a dopant. Suitable dopants for use with zirconium oxide dielectric layers include Al, Ce, Co, Er, Eu, F, Ga, Gd, Ge, Hf, La, Mg, N, Si, Sn, Sr, Ti, Y, or combinations thereof. However, those skilled in the art will understand that the present methods may be applied to many dielectric layers. Examples of suitable dielectric layers include aluminum oxide, barium-strontium-titanate (BST), hafnium oxide, hafnium silicate, niobium oxide, lead-zirconium-titanate (PZT), a bilayer of silicon oxide and silicon nitride, silicon oxy-nitride, strontium-titanate (STO), tantalum oxide, titanium oxide, zirconium oxide, or combinations thereof.

As was described previously, the cell capacitor, 800, includes a first electrode layer, 804, formed above substrate, 801. The first electrode layer, 804, is connected to the source or drain of the cell transistor, 802. For illustrative purposes, the first electrode has been connected to the source, 814, in this example. First electrode layer, 804, is formed above substrate, 801. Generally, the substrate has already received several processing steps in the manufacture of a full DRAM device. The first electrode layer may be a single layer or may be formed from multiple layers. First electrode layer, 804, includes one of metals, metal alloys, conductive metal oxides, conductive metal nitrides, conductive metal silicides, conductive metal carbides, etc. In some embodiments, the first electrode layer includes one of ruthenium, platinum, titanium nitride, tantalum nitride, titanium-aluminum-nitride, tungsten, tungsten nitride, molybdenum, molybdenum nitride, or vanadium nitride. For this example, first electrode layer, 804, includes a conductive metal nitride. Examples of such conductive metal nitrides include the conductive compounds of cobalt nitride, molybdenum nitride, nickel nitride, tantalum nitride, titanium nitride, titanium aluminum nitride, tungsten nitride, or combinations thereof. A specific electrode layer of interest is titanium nitride when zirconium oxide is used as the dielectric layer. The titanium nitride is typically formed using PVD, PECVD, CVD, or ALD. The TiN first electrode layer may optionally receive an RTA anneal treatment before the formation of the dielectric layer as discussed previously.

Flash layer, 806, is formed above first electrode layer, 804. Flash layer, 806, includes one of metal oxides, metal nitrides, metal silicides, metal carbides, etc. In some embodiments, flash layer, 806, includes a metal oxide. The metal oxide may be formed using an ALD technique wherein the metal precursor contains at least one metal-oxygen bond and wherein the metal precursor contains at least one metal-bulky ligand bond. The flash layer may be deposited using an ALD process at a temperature between 200 C and 350 C. The ALD process may be performed at a pressure between 0.1 Torr and 2.0 Torr. The pulse time of the precursor pulse will typically be between 0.1 second and 180 seconds. Ozone is typically used as the reactant. The flash layer typically has a thickness between 1 A and 10 A. A specific example of a metal oxide flash layer includes titanium oxide when zirconium oxide is used as the dielectric layer. Other metal oxides of interest include aluminum oxide, cerium oxide, europium oxide, gadolinium oxide, gallium oxide, germanium oxide, lanthanum oxide, molybdenum oxide, nickel oxide, ruthenium oxide, silicon oxide, tin oxide, and the like.

Dielectric layer, 808, is then formed above the flash layer. Suitable dielectric layers include at least one of aluminum oxide, barium-strontium-titanate (BST), hafnium oxide, hafnium silicate, niobium oxide, lead-zirconium-titanate (PZT), a bilayer of silicon oxide and silicon nitride, silicon oxy-nitride, strontium-titanate (STO), tantalum oxide, titanium oxide, zirconium oxide, or combinations thereof. The dielectric layer may be a single layer or may be formed from multiple layers. In some embodiments, the dielectric layer includes zirconium oxide. The zirconium oxide may further include a dopant. Suitable dopants for use with zirconium oxide dielectric layers include Al, Ce, Co, Er, Eu, F, Ga, Gd, Ge, Hf, La, Mg, N, Si, Sn, Sr, Ti, Y, or combinations thereof.

Capping layer, 810, is formed above dielectric layer, 808. Capping layer, 810, includes one of metal oxides, metal nitrides, metal silicides, metal carbides, etc. In some embodiments, capping layer, 810, includes a metal oxide. The metal oxide may be formed using an ALD technique wherein the metal precursor contains at least one metal-oxygen bond and wherein the metal precursor contains at least one metal-bulky ligand bond. The capping layer may be deposited using an ALD process at a temperature between 200 C and 350 C. The ALD process may be performed at a pressure between 0.1 Torr and 2.0 Torr. The pulse time of the precursor pulse will typically be between 0.1 second and 180 seconds. Ozone is typically used as the reactant. The capping layer typically has a thickness between 1 A and 15 A. A specific example of a metal oxide capping layer includes titanium oxide when zirconium oxide is used as the dielectric layer. Other metal oxides of interest include aluminum oxide, cerium oxide, europium oxide, gadolinium oxide, gallium oxide, germanium oxide, lanthanum oxide, molybdenum oxide, nickel oxide, ruthenium oxide, silicon oxide, tin oxide, and the like.

Second electrode layer, 812, is then formed above the capping layer to form a capacitor stack. The second electrode layer may be a single layer or may be formed from multiple layers. Second electrode layer, 812, includes one of metals, metal alloys, conductive metal oxides, conductive metal nitrides, conductive metal silicides, conductive metal carbides, etc. In some embodiments, the second electrode layer includes one of ruthenium, platinum, titanium nitride, tantalum nitride, titanium-aluminum-nitride, tungsten, tungsten nitride, molybdenum, molybdenum nitride, or vanadium nitride. For this example, second electrode layer, 812, includes a conductive metal nitride. Examples of such conductive metal nitrides include the conductive compounds of cobalt nitride, molybdenum nitride, nickel nitride, tantalum nitride, titanium nitride, titanium aluminum nitride, tungsten nitride, or combinations thereof. A specific electrode layer of interest is titanium nitride when zirconium oxide is used as the dielectric layer. The titanium nitride is typically formed using PVD, PECVD, CVD, or ALD. The capacitor stack may receive a PMA treatment as discussed previously.

Figure 9:
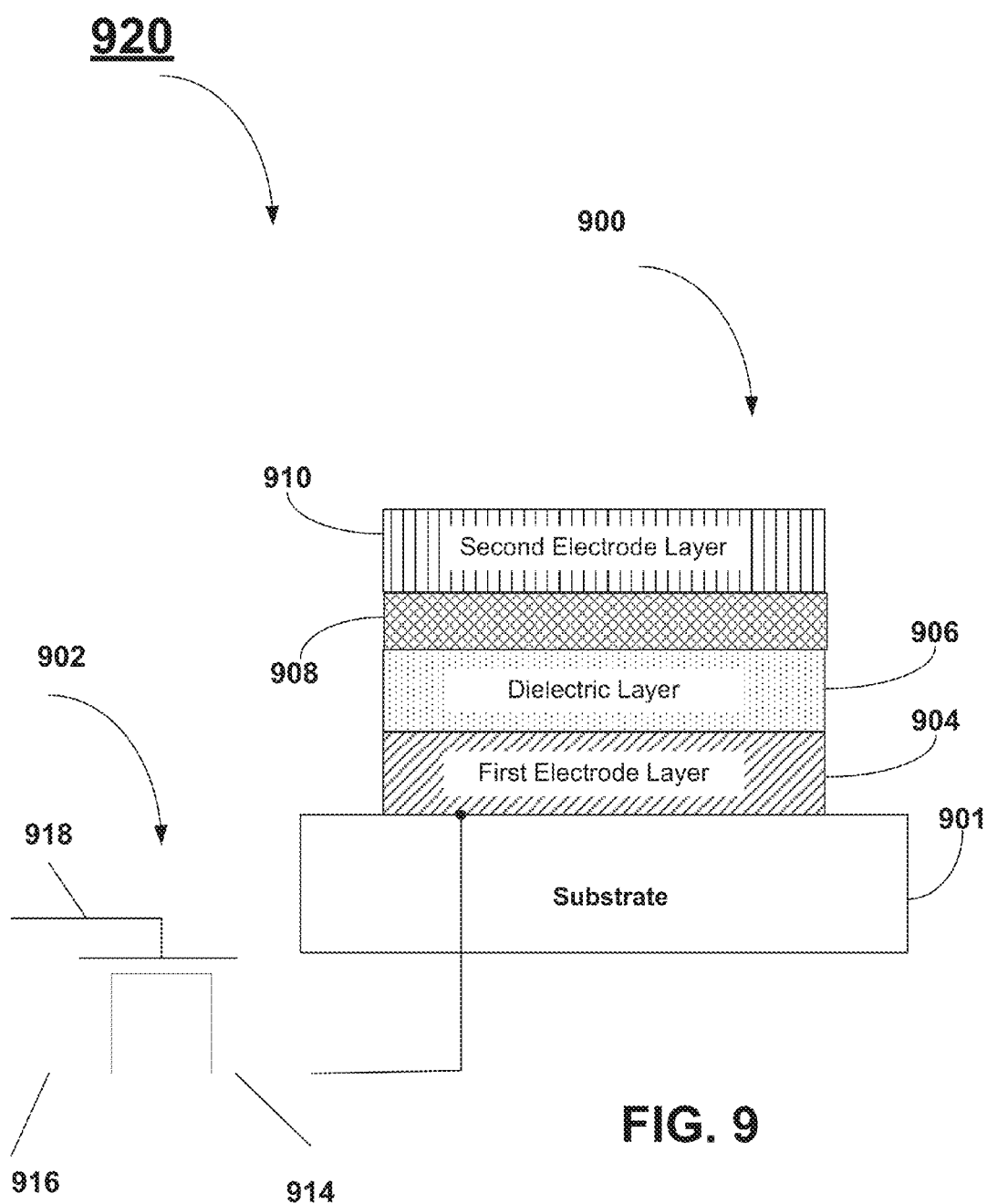
FIG. 9 illustrates a simplified cross-sectional view of a DRAM memory cell fabricated in accordance with some embodiments.

FIG. 9 is used to illustrate one DRAM cell, 920, manufactured using a structure as discussed previously in reference to FIG. 6. The cell, 920, is illustrated schematically to include two principle components, a cell capacitor, 900, and a cell transistor, 902. The cell transistor is usually constituted by a MOS transistor having a gate, 918, source, 914, and drain, 916. The gate is usually connected to a word line and one of the source or drain is connected to a bit line. The cell capacitor, 900, has a lower or storage electrode, 904, and an upper or plate electrode, 910. The storage electrode is connected to the other of the source or drain and the plate electrode is connected to a reference potential conductor. The cell transistor is, when selected, turned "on" by an active level of the word line to read or write data from or into the cell capacitor via the bit line.

FIG. 9 illustrates a simplified cross-sectional view of a DRAM cell fabricated in accordance with some embodiments. In some embodiments, the dielectric layer includes zirconium oxide. The zirconium oxide may further include a dopant. Suitable dopants for use with zirconium oxide dielectric layers include Al, Ce, Co, Er, Eu, F, Ga, Gd, Ge, Hf, La, Mg, N, Si, Sn, Sr, Ti, Y, or combinations thereof. However, those skilled in the art will understand that the present methods may be applied to many dielectric layers. Examples of suitable dielectric layers include aluminum oxide, barium-strontium-titanate (BST), hafnium oxide, hafnium silicate, niobium oxide, lead-zirconium-titanate (PZT), a bilayer of silicon oxide and silicon nitride, silicon oxy-nitride, strontium-titanate (STO), tantalum oxide, titanium oxide, zirconium oxide, or combinations thereof.

As was described previously, the cell capacitor, 900, includes a first electrode layer, 904, formed above substrate, 901. The first electrode layer, 904, is connected to the source or drain of the cell transistor, 902. For illustrative purposes, the first electrode has been connected to the source, 914, in this example. First electrode layer, 904, is formed above substrate, 901. Generally, the substrate has already received several processing steps in the manufacture of a full DRAM device. The first electrode layer may be a single layer or may be formed from multiple layers. First electrode layer, 904, includes one of metals, metal alloys, conductive metal oxides, conductive metal nitrides, conductive metal silicides, conductive metal carbides, etc. In some embodiments, the first electrode layer includes one of ruthenium, platinum, titanium nitride, tantalum nitride, titanium-aluminum-nitride, tungsten, tungsten nitride, molybdenum, molybdenum nitride, or vanadium nitride. For this example, first electrode layer, 904, includes a conductive metal nitride. Examples of such conductive metal nitrides include the conductive compounds of cobalt nitride, molybdenum nitride, nickel nitride, tantalum nitride, titanium nitride, titanium aluminum nitride, tungsten nitride, or combinations thereof. A specific electrode layer of interest is titanium nitride when zirconium oxide is used as the dielectric layer. The titanium nitride is typically formed using PVD, PECVD, CVD, or ALD. The TiN first electrode layer may optionally receive an RTA anneal treatment before the formation of the dielectric layer as discussed previously.

Dielectric layer, 906, is then formed above the first electrode layer layer. Suitable dielectric layers include at least one of aluminum oxide, barium-strontium-titanate (BST), hafnium oxide, hafnium silicate, niobium oxide, lead-zirconium-titanate (PZT), a bilayer of silicon oxide and silicon nitride, silicon oxy-nitride, strontium-titanate (STO), tantalum oxide, titanium oxide, zirconium oxide, or combinations thereof. The dielectric layer may be a single layer or may be formed from multiple layers. In some embodiments, the dielectric layer includes zirconium oxide. The zirconium oxide may further include a dopant. Suitable dopants for use with zirconium oxide dielectric layers include Al, Ce, Co, Er, Eu, F, Ga, Gd, Ge, Hf, La, Mg, N, Si, Sn, Sr, Ti, Y, or combinations thereof.

Capping layer, 908, is formed above dielectric layer, 906. Capping layer, 908, includes one of metal oxides, metal nitrides, metal silicides, metal carbides, etc. In some embodiments, capping layer, 908, includes a metal oxide. The metal oxide may be formed using an ALD technique wherein the metal precursor contains at least one metal-oxygen bond and wherein the metal precursor contains at least one metal-bulky ligand bond. The capping layer may be deposited using an ALD process at a temperature between 200 C and 350 C. The ALD process may be performed at a pressure between 0.1 Torr and 2.0 Torr. The pulse time of the precursor pulse will typically be between 0.1 second and 180 seconds. Ozone is typically used as the reactant. The capping layer typically has a thickness between 1 A and 15 A. A specific example of a metal oxide capping layer includes titanium oxide when zirconium oxide is used as the dielectric layer. Other metal oxides of interest include aluminum oxide, cerium oxide, europium oxide, gadolinium oxide, gallium oxide, germanium oxide, lanthanum oxide, molybdenum oxide, nickel oxide, ruthenium oxide, silicon oxide, tin oxide, and the like.

Second electrode layer, 910, is then formed above the capping layer to form a capacitor stack. The second electrode layer may be a single layer or may be formed from multiple layers. Second electrode layer, 910, includes one of metals, metal alloys, conductive metal oxides, conductive metal nitrides, conductive metal silicides, conductive metal carbides, etc. In some embodiments, the second electrode layer includes one of ruthenium, platinum, titanium nitride, tantalum nitride, titanium-aluminum-nitride, tungsten, tungsten nitride, molybdenum, molybdenum nitride, or vanadium nitride. For this example, second electrode layer, 910, includes a conductive metal nitride. Examples of such conductive metal nitrides include the conductive compounds of cobalt nitride, molybdenum nitride, nickel nitride, tantalum nitride, titanium nitride, titanium aluminum nitride, tungsten nitride, or combinations thereof. A specific electrode layer of interest is titanium nitride when zirconium oxide is used as the dielectric layer. The titanium nitride is typically formed using PVD, PECVD, CVD, or ALD. The capacitor stack may receive a PMA treatment as discussed previously.

Although the foregoing examples have been described in some detail for purposes of clarity of understanding, the disclosure is not limited to the details provided. There are many alternative ways of implementing the teachings. The disclosed examples are illustrative and not restrictive.

What is claimed:

1. A method for forming a capacitor stack comprising:
   forming a first electrode layer above a substrate;
   forming a dielectric layer above the first electrode layer;
   forming a second electrode layer above the dielectric layer;
   the method further comprising at least one of forming a flash layer between the first electrode layer and the dielectric layer, or forming a capping layer between the dielectric layer and the second electrode layer;
   wherein at least the one of the flash layer or the capping layer is formed by an ALD technique using a metal precursor that includes a metal-oxygen bond and a metal-bulky ligand bond.

2. The method of claim 1, wherein the flash layer comprises at least one of titanium oxide, aluminum oxide, cerium oxide, europium oxide, gadolinium oxide, gallium oxide, germanium oxide, lanthanum oxide, molybdenum oxide, nickel oxide, ruthenium oxide, silicon oxide or tin oxide.

3. The method of claim 2, wherein the flash layer comprises titanium oxide.

4. The method of claim 1, wherein the capping layer comprises at least one of titanium oxide, aluminum oxide, cerium oxide, europium oxide, gadolinium oxide, gallium oxide, germanium oxide, lanthanum oxide, molybdenum oxide, nickel oxide, ruthenium oxide, silicon oxide or tin oxide.

5. The method of claim 4, wherein the capping layer comprises titanium oxide.

6. The method of claim 1, wherein the metal precursor comprises titanium.

7. The method of claim 6, wherein the metal precursor includes pentamethylcyclopentadieneyltitanium-trimethoxide ($[C_5(CH_3)_5]Ti(OCH_3)_3$).

8. The method of claim 1, wherein the dielectric layer comprises one of aluminum oxide, barium-strontium-titanate (BST), hafnium oxide, hafnium silicate, niobium oxide, lead-zirconium-titanate (PZT), a bilayer of silicon oxide and silicon nitride, silicon oxy-nitride, strontium-titanate (STO), tantalum oxide, titanium oxide and zirconium oxide.

9. The method of claim 8, wherein the dielectric layer comprises zirconium oxide.

10. The method of claim 1, wherein at least the one of the flash layer or the capping layer has a thickness between about 1 A and about 10 A.

11. The method of claim 1, wherein at least the one of the flash layer or the capping layer is formed under process conditions that result in a deposition rate that is less than 0.5 A/cycle.

12. The method of claim 1, wherein at least the one of the flash layer or the capping layer is formed at a temperature between 200 C and 350 C.

* * * * *